US009378989B2

(12) United States Patent
Mertens et al.

(10) Patent No.: US 9,378,989 B2
(45) Date of Patent: Jun. 28, 2016

(54) METHOD AND APPARATUS FOR CLEANING SEMICONDUCTOR SUBSTRATES

(75) Inventors: Paul Mertens, Bonheiden (BE); Steven Brems, Kessel-Lo (BE); Elisabeth Camerotto, Heverlee (BE); Marc Hauptmann, Heverlee (BE)

(73) Assignees: IMEC, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 789 days.

(21) Appl. No.: 13/453,832

(22) Filed: Apr. 23, 2012

(65) Prior Publication Data
US 2012/0266912 A1 Oct. 25, 2012

(30) Foreign Application Priority Data

Apr. 21, 2011 (EP) .................................. 11163336

(51) Int. Cl.
*B08B 3/12* (2006.01)
*B08B 13/00* (2006.01)
*H01L 21/67* (2006.01)
*H01L 21/02* (2006.01)

(52) U.S. Cl.
CPC .... *H01L 21/67057* (2013.01); *H01L 21/02096* (2013.01); *B08B 3/12* (2013.01)

(58) Field of Classification Search
CPC .................. H01L 21/02096; H01L 21/67057; B08B 3/12
See application file for complete search history.

(56) References Cited

U.S. PATENT DOCUMENTS

| 2,366,822 | A | * | 1/1945 | Willard ........................ 359/285 |
| 3,385,570 | A | * | 5/1968 | Put et al. ...................... 366/114 |
| 4,836,684 | A | | 6/1989 | Javorik et al. |
| 5,379,785 | A | | 1/1995 | Ohmori et al. |
| 5,427,622 | A | | 6/1995 | Stanasolovich et al. |
| 5,520,205 | A | * | 5/1996 | Guldi et al. ................. 134/98.1 |
| 5,533,540 | A | * | 7/1996 | Stanasolovich et al. ...... 134/155 |
| 6,240,938 | B1 | * | 6/2001 | Oshinowo ..................... 134/147 |
| 6,276,370 | B1 | * | 8/2001 | Fisch et al. ..................... 134/1.3 |
| 6,311,702 | B1 | * | 11/2001 | Fishkin ......................... 134/1.3 |
| 2002/0139390 | A1 | * | 10/2002 | Okano et al. .................. 134/1.3 |
| 2003/0188770 | A1 | * | 10/2003 | Doi ............................ 134/102.1 |
| 2004/0050408 | A1 | * | 3/2004 | Christenson et al. ......... 134/184 |
| 2004/0074514 | A1 | * | 4/2004 | Sharma et al. ..................... 134/1 |
| 2004/0103919 | A1 | * | 6/2004 | Kenny et al. .................... 134/19 |

(Continued)

OTHER PUBLICATIONS

Hatano, Hajime et al., "High-Frequency Ultrasonic Cleaning Tank Utilizing Oblique Incidence", IEEE Transactions on Ultrasonic Ferroelectrics, and Frequency Control, vol. 43, No. 4, Jul. 1996, pp. 531-535.

(Continued)

*Primary Examiner* — Alexander Markoff
(74) *Attorney, Agent, or Firm* — McDonnell Boehnen Hulbert & Berghoff LLP

(57) ABSTRACT

The present invention is related to a method and apparatus for cleaning a substrate, in particular a semiconductor substrate such as a silicon wafer. The substrate is placed in a tank containing a cleaning liquid, at an angle with respect to acoustic waves produced in said liquid. The angle corresponds to the angle of transmission, i.e. the angle at which waves are not reflected off the substrate surface. A damping material is provided in the tank, arranged to absorb substantially all waves thus transmitted through the substrate. A significant improvement in terms of cleaning efficiency is obtained by the method of the invention.

20 Claims, 3 Drawing Sheets

(56) References Cited

U.S. PATENT DOCUMENTS

| | | | |
|---|---|---|---|
| 2005/0003737 A1* | 1/2005 | Montierth | A61B 8/546 451/5 |
| 2005/0145265 A1* | 7/2005 | Ravkin et al. | 134/21 |
| 2005/0252522 A1 | 11/2005 | Struven et al. | |
| 2006/0151014 A1* | 7/2006 | Obweger et al. | 134/94.1 |
| 2007/0151576 A1* | 7/2007 | Christenson et al. | 134/2 |

OTHER PUBLICATIONS

European Search Report, European Patent Application No. 11163336 dated Mar. 8, 2012.

Xu, K. et al., "Relation Between Particle Density and Haze on a Wafer: a New Approach to Measuring Nano-Sized Particles", Solid State Phenomena, vol. 19, 2003, pp. 161-164.

\* cited by examiner

METHOD AND APPARATUS FOR CLEANING SEMICONDUCTOR SUBSTRATES

BACKGROUND

Ultrasonic and megasonic wafer cleaning methods are known in the semiconductor industry, in particular for cleaning silicon wafers. The general principle is to bring the wafer into contact with a cleaning liquid, usually by submerging the wafer in a liquid-filled tank, and to apply acoustic energy to the cleaning liquid, by way of an acoustic transducer. Most known applications use acoustic waves in the ultrasonic (<200 kHz) or megasonic (up to or above 1 MHz) frequency range. In the presence of a gaseous substance dissolved in or added to the liquid, the acoustic energy causes cavitation, i.e. the creation of bubbles that oscillate or even collapse. The bubbles assist in the removal of particles from the wafer surface, due to the drag forces created by the bubble formation, the oscillation, or by drag forces created when bubbles become unstable and collapse. However, current techniques suffer from a number of problems.

At ultrasonic frequencies, resonant bubbles are large and collapse more heavily, leading to an increased risk of damaging the substrate and the structures present on it. Megasonic cleaning leads to smaller resonant bubbles and lower damage risk. However, as the structures present in integrated circuits are made smaller each new generation of technology, the damage risk remains. On the other hand, when the bubbles are smaller than resonant size, they do not sufficiently contribute to the removal of particles from the wafer surface. Presently known acoustic cleaning methods rely on the formation of standing waves in the cleaning liquid, due to reflection of acoustic waves off the surface to be cleaned. In a standing wave, bubbles are attracted towards nodes and antinodes. As a result, the bubble concentration can be very high locally. Those densely packed bubbles can influence each other (less control over bubble oscillation) and the bubble coalescence rate will be much higher (less control over bubble size).

SUMMARY

The invention is related to a method and apparatus as disclosed in the appended claims.

For Cleaning Semiconductor Substrates

In one embodiment, a method for cleaning a substrate includes the steps of:
  submerging the substrate in a liquid,
  producing acoustic waves in the liquid, the waves propagating in a wave propagation direction,
  orienting the substrate at an angle with respect to the wave propagation direction, the angle being preferably an oblique angle chosen so as to maximize the transmission of the acoustic waves through the substrate, and
  substantially absorbing all of the acoustic waves transmitted through the substrate.

In another embodiment,
  the substrate is submerged in a tank filled with a liquid,
  said waves are produced by a transducer arranged in connection with said tank,
  the substrate is maintained at said angle by a suitable holding means within said tank,
  a layer of said damping material is arranged in said tank at least at a location opposite to said transducer, with the substrate placed between the transducer and the damping material located opposite the transducer.

According to an embodiment, a gas is dissolved in said liquid or added to said liquid during the production of said acoustic waves. The layer of damping material may be is separated from the liquid by a plate, said plate being transparent to said acoustic waves.

The invention is equally related to an apparatus for cleaning a substrate, comprising:
  a tank suitable for holding a cleaning liquid,
  an acoustic transducer arranged in connection with said tank so as to be able to produce acoustic waves propagating in a cleaning liquid in said tank,
  a holding means for holding and maintaining a substrate in said tank, at an angle to the propagation direction of said waves, wherein said angle is preferably an oblique angle
  a layer of damping material placed at least at a location opposite to said transducer, with the substrate holding means in between the transducer and the damping material located opposite the transducer.

In an apparatus of the invention, said layer of damping material may be separated from the interior of said tank by a plate which is transparent to acoustic waves of at least one frequency. Said plate may be a quartz plate.

According to an embodiment of the apparatus of the invention, said tank has two parallel side walls spaced apart to allow the passage of a substrate in the space between said side walls, whilst oriented parallel to said side walls, wherein the first side wall is provided with a side arm oriented at an oblique angle to said first side wall, with an acoustic transducer arranged at the distal end of said side arm, and wherein the second side wall comprises or is connected to a layer of damping material.

An apparatus according to the invention may further be provided with a means for circulating said liquid out of said tank, over a liquid filtering system or the like, and back into the tank.

In an apparatus according to the invention, a layer of damping material may be present on each side of said substrate holding means.

DETAILED DESCRIPTION OF THE FIGURES

The invention is related to a method wherein a substrate is cleaned by the action of acoustic waves travelling through a liquid in an enclosure, and wherein substantially no reflections of acoustic waves occur in the enclosure. Preferably a gas is dissolved in or added to the liquid, in order to generate cavitation bubbles and thereby increase the cleaning efficiency. The lack of reflections off the walls of the enclosure is obtained by applying a suitable damping material. Reflections off the substrate surface are eliminated by orienting the substrate at the transmission angle with respect to the wave propagation direction. The result is that any standing waves are substantially suppressed, not only standing waves appearing through reflections off the substrate, but also standing waves appearing through reflections off the tank walls. This improves the cleaning efficiency to an unexpectedly high degree.

Figure 1:
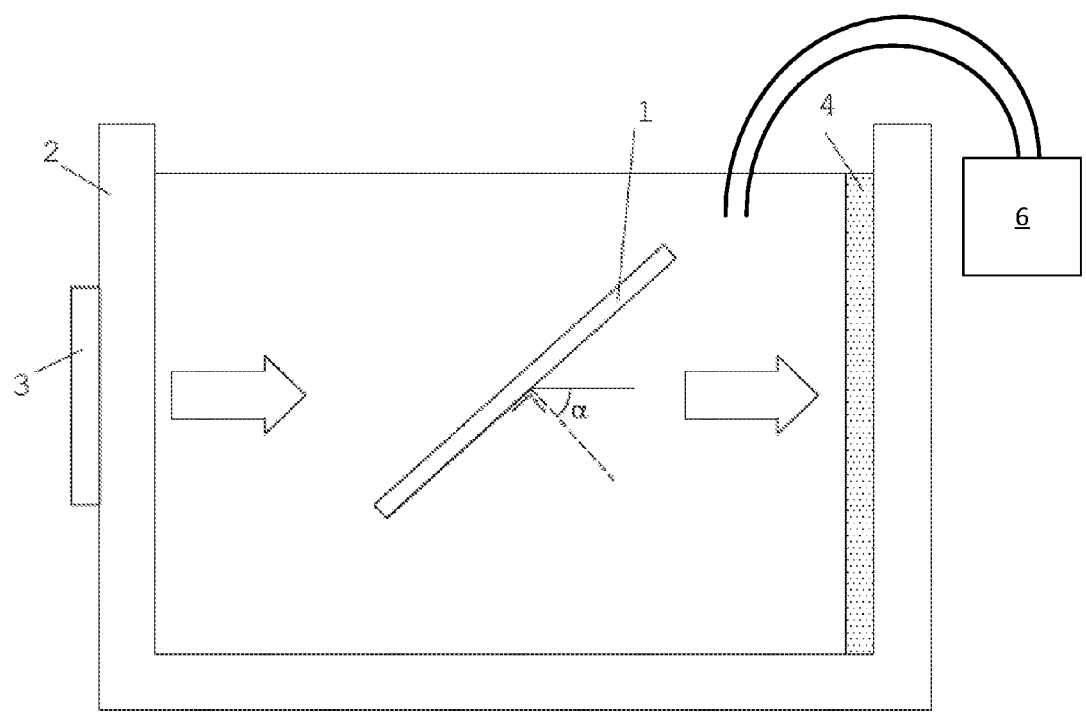
FIG. 1 illustrates the method of the invention, and the basic elements of an apparatus of the invention.

FIG. 1 shows an apparatus suitable for performing the method of the invention. The substrate, e.g. a Si wafer 1, is placed in a tank 2 filled with a cleaning liquid. An acoustic transducer 3 is attached to the side of the tank. The direction of the waves propagating from the transducer through the liquid are indicated by the arrows. The wafer is placed at an angle with respect to the propagation direction, said angle being preferably an oblique angle. The angle α shown in FIG. 1 is the angle of incidence of the waves on the substrate. When the angle α is equal to the so-called 'transmission angle', the waves travel through the substrate 1 without any substantial reflection off the substrate surface. The existence of such a transmission angle is known in the art. The value of this angle depends on the thickness and material of the substrate, the frequency of the acoustic waves and the type of liquid in the tank. At the transmission angle position, the waves are travelling through the liquid as if the wafer isn't there. According to the method of the invention, the waves are not reflected back from the opposite side wall of the tank, but they are substantially absorbed by a layer 4 of damping material placed opposite the transducer, with the wafer in between the transducer and the damping material.

It has been found by the inventors that the particle removal efficiency of the acoustic waves is greatly improved by minimizing acoustic reflections, i.e. by orienting the wafer at the transmission angle and applying the damping material. This is illustrated by the examples discussed further in this description. It must be noted that the maximum acoustic pressure for a travelling wave is almost half compared to a standing wave. As a result, a travelling wave results in better cleaning at lower power densities.

Referring again to FIG. 1, the basic elements of an apparatus of the invention are illustrated, comprising a tank 2 suitable for containing a cleaning liquid, an acoustic transducer 3 arranged to be able to produce a propagating acoustic wave through the liquid, and a means 5 for placing a substrate in the tank, at an angle with respect to the transducer, said angle being preferably an oblique angle. At least opposite the transducer, a damping material 4 is present, configured to absorb travelling waves emitted by the transducer 3. Damping material may also be present on other sides of the substrates, for example attached to all four vertical walls of a rectangular tank 2. In the latter case, an opening must be provided in the damping material at the position of the acoustic transducer 3, in order to allow the acoustic waves to enter the liquid.

The type of cleaning liquid and transducer can be any type known in the art. The gas that can be added to the liquid can be any suitable gas, e.g. oxygen, nitrogen, carbon dioxide, xenon, argon or helium. The gas may be dissolved in the liquid prior to the activation of the acoustic waves, or the apparatus may comprise or work in conjunction with a suitable gasification system known in the art, e.g. a membrane contactor. The ambient pressure of the liquid, the hydrostatic pressure of the liquid, the vapour pressure of the gas, the liquid flow, the liquid temperature and the contact area between gas and liquid are the main parameters to control the amount of gas dissolved in the liquid. The higher the pressure of the liquid and the lower the temperature the more gas can be dissolved in the liquid. The amount and the saturation level of the gas dissolved will have an influence on the bubble formation. Instead of forming bubbles out of dissolved gas, immediate injection of bubbles in the liquid can be applied. A bubbler system, a capillary, a nozzle, etc. can inject gas bubbles in the liquid. Also a membrane contactor with a dedicated pore size, separating the liquid from the supplied gas, can be used.

The damping material may be any material suitable for this purpose. The damping material may be chosen in accordance with the applicable frequency and the type of cleaning liquid. The thickness of the damping material should be sufficient so that the majority of the acoustic waves are absorbed. The damping material may be in direct contact with the cleaning liquid. Alternatively, an acoustically transparent plate may be placed between the liquid and the damping material, so as to separate the liquid from the damping material. An example of such an acoustically transparent plate is a quartz plate with a thickness suitable for making the plate transparent for acoustic waves of a particular frequency. The latter embodiment is useful in the cases where the damping material is chemically incompatible with the cleaning liquid, or generally to avoid contamination of or by the damping material. The liquid in the tank 2 may be stationary, in which case the liquid needs to be replaced after a given time, when the liquid has become contaminated with particles removed from substrates cleaned by the method of the invention. Alternatively, the tank may be applied in recirculation mode: in that case the tank is connected to a suitable liquid circulation means, by which liquid is constantly flowing out of the tank, preferably to a filtering apparatus, such as a liquid filtering system 6, and after filtering recirculated back to the tank. Preferably the liquid volume present in the tank at any moment in time remains substantially unchanged in said recirculation mode.

Figure 2:
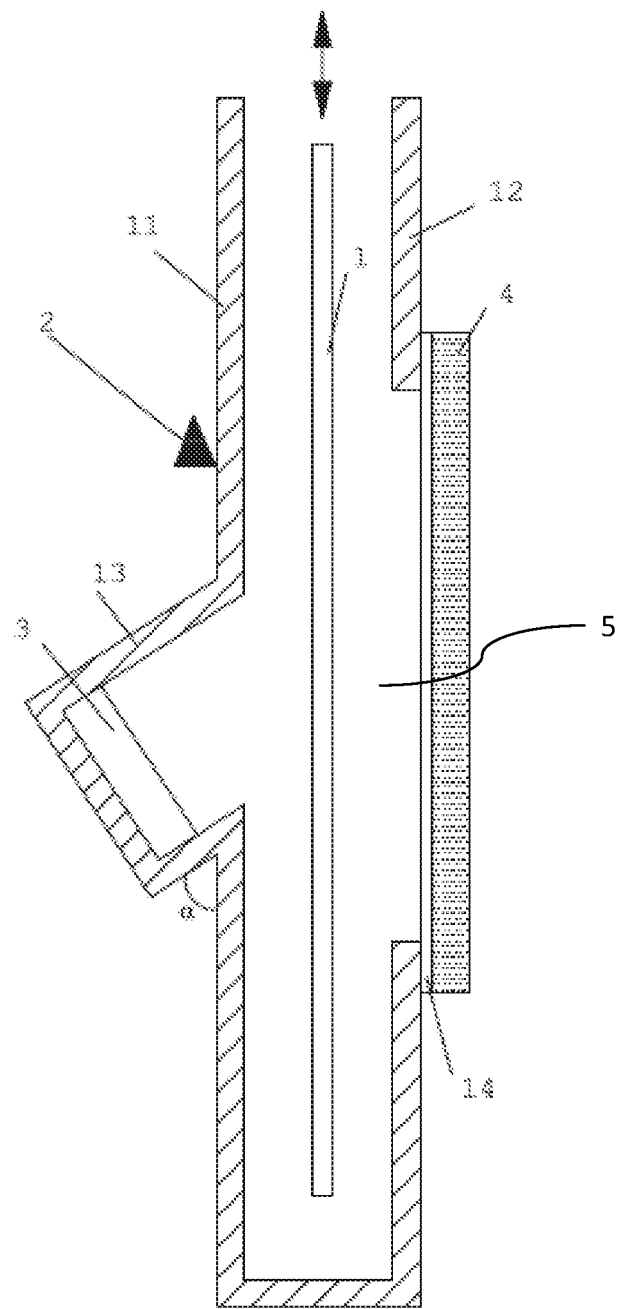
FIG. 2 illustrates an apparatus according to a specific embodiment of the invention.

FIG. 2 illustrates a specific embodiment of the apparatus of the invention, wherein the tank 2 has a narrow elongate shape, preferably to be placed upright, with the means for holding the substrate being configured so that the substrate 1 is placed vertically, between parallel first and second side walls (11,12) of the tank. Extending outward from the first side wall 11 is a side-arm 13 of the tank, extending at an angle α with respect to the side wall 11. At the distal end of the side-arm 13, the acoustic transducer 3 is mounted, so as to be able to produce acoustic waves propagating through the interior of the side-arm towards the substrate 1. At the opposite side wall 12 of the tank, a damping material 15 is attached, facing the substrate surface. Preferably, a thin acoustically transparent plate 14, e.g. a quartz plate, is mounted between the interior of the tank and the damping material. In the embodiment shown, the damping material 4 and quartz plate 14 are attached to the outer surface of the side wall 12, which is provided with an opening 15. In this way, it can be said the actual side wall of the tank is formed by the side wall 12 and the damping material 4. Alternatively, side wall 12 may be solid and the damping material (and possibly quartz plate) placed inside the tank, similarly as in FIG. 1. The substrate may be held stationary inside the tank, for which purpose a suitable holding means 5 is provided, which may be a holding means known as such in the art. According to an embodiment, the suitable holding means 5 is further provided to move the substrate up and down in the direction of the substrate surface (see arrows), during the cleaning operation. The main advantage of this embodiment is the reduction in tank volume. In optimal conditions, chemistries will be added (e.g. APM=ammonium peroxide $NH_4OH:H_2O_2:H_2O$). A lower volume will result in a decreased chemical consumption. When the apparatus of FIG. 2 is used in recirculation mode, a lower liquid flow rate is required compared to a larger tank. The lower flow rate also makes the design of a gasification system more easy.

The acoustic waves may be generated by a continuous signal, or by a pulsed signal. A pulse signal can tune the average bubble size close to resonant size and improve cleaning further. During 'pulse on' times (acoustic signal applied at a given frequency), bubbles will grow through rectified diffusion. During 'pulse off' times (no signal applied), bubbles will shrink when the liquid saturation level is not too high. The optimum 'pulse on' and 'pulse off' times depend on the dissolved gas concentration.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

EXAMPLES

Test Results

With the apparatus of FIG. 1, a number of experiments were conducted. The substrate that was tested was a Si wafer (diameter 200 mm), with silica particles with a diameter around 78 nm deposited on the surface. Cleaning performance is evaluated by measuring local Particle Removal Efficiency (PRE) using light scattering in the haze mode, as described by K. Xu et al., Solid State Phenom. 92 (2003), p. 161. The cleaning liquid was water which was slightly oversaturated with oxygen (~120% of the saturation level). The tank was rectangular in shape (40 by 40 by 40 $cm^3$) with a direct type transducer attached to a side wall. All the vertical walls were covered, with an opening in the damping layer at the position of the transducer completely by a damping material, the commercially available Aptflex F28 from Precision Acoustics (thickness 1 cm and a density of 1.01 g/m3 which is close to that of water).

Figure 3:
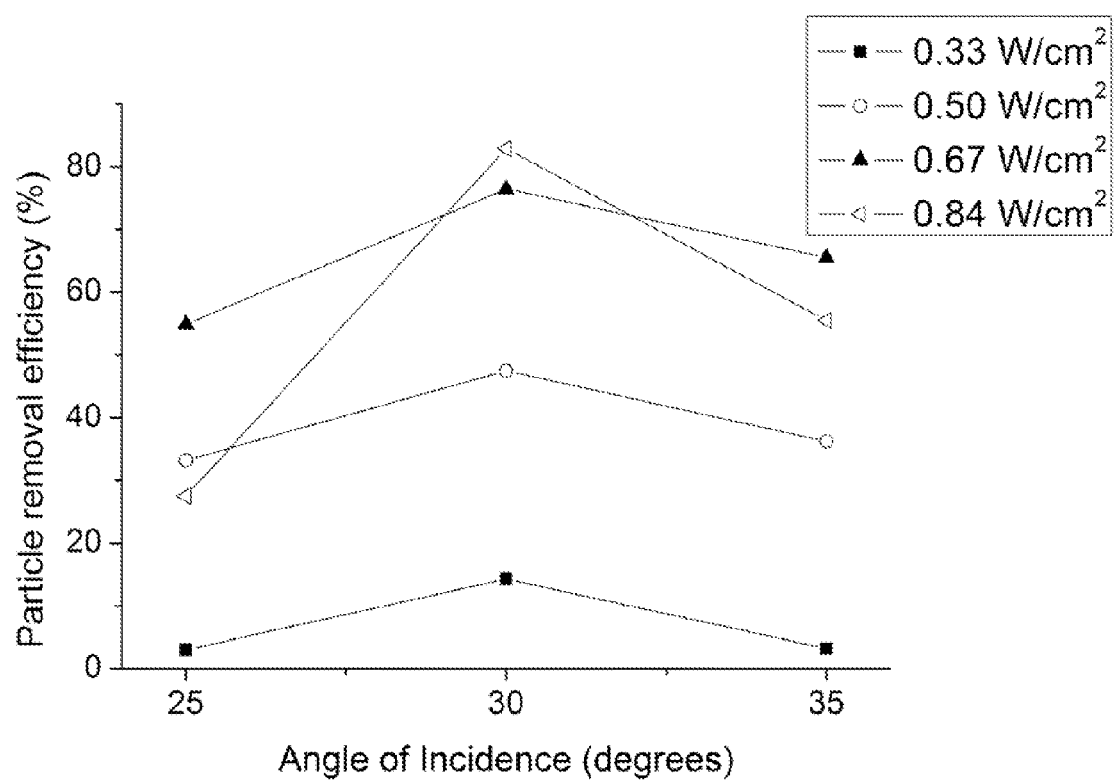
FIG. 3 is a graph that shows the particle removal efficiency as a function of the angle of incidence, for various values of the acoustic power.

A continuous acoustic field is applied at a frequency of 928 kHz and at different levels of power produced by the transducer. The graph in FIG. 3 shows the PRE as a function of the angle of incidence α for different power levels, proving that the highest cleaning efficiency is obtained around α=30°, which coincides with the transmission angle for a 200 mm Si wafer.

The effectiveness of the damping layer is illustrated by a comparative test, wherein cleaning was performed under the same circumstances and in the same apparatus as the previously described experiment, once with and once without a damping layer. Tests with a damping layer were performed with damping material on all four walls, with an opening at the position of the transducer.

The cleaning recipe in both tests was the following:
pulsed signal: 'Pulse on' time 250 ms
Duty cycle 30% (i.e. 'pulse off' time 583 ms)
Gas concentration: slightly oversaturated
Cleaning time 4 min
Wafer moved 1.5 cm up and down and shifted 0.5 cm horizontally. This movement optimizes the cleaning uniformity, as the acoustic field is generally non-uniform
Frequency acoustic field: 928 kHz
Power 40 W (670 $mW/cm^2$)

An additional test was done with damping material and with a continuous signal instead of a pulsed signal, and all other parameters the same, except for a higher power level at 840 $mW/cm^2$).

The first two rows of table 1 compare the PRE as a function of the offset from the transmission angle, with and without the damping material. The results show that PRE is optimized by orienting the substrate at the transmission angle, also without the application of a damping layer. However, when the damping layer is added, i.e. when the cleaning is done only by travelling waves, the cleaning efficiency is considerably increased, much more than might be expected. The third row of table 1 shows that the continuous signal requires a higher acoustic power to obtain similar values for the PRE. A pulsed signal is therefore capable of producing improved cleaning efficiency at lower power levels.

TABLE 1

| | Offset from transmission angle (°) | | | | | | | | | | |
|---|---|---|---|---|---|---|---|---|---|---|---|
| | −10 | −8 | −4 | −2 | 0 | 2 | 4 | 8 | 10 | 20 | 30 |
| Average PRE with damping (%) - pulsed signal | 0.1 | 0.9 | 42.4 | 78.2 | 85.5 | 28 | 29.2 | 33.2 | 21.7 | 6.16 | 2.3 |
| Average PRE without damping (%) - pulsed signal | <4 | <4 | <4 | <4 | 3.8 | <4 | <4 | <4 | <4 | <4 | <4 |
| Average PRE with damping (%) - continuous signal | NA | NA | 27.5 | NA | 82.9 | NA | 55.5 | NA | NA | NA | NA |

(NA = not measured)

The invention claimed is:

1. A method for cleaning a substrate, comprising:
submerging the substrate in a liquid, wherein the substrate is submerged in a tank filled with the liquid, wherein the tank comprises a first side wall and a second side wall parallel to the first side wall, wherein the tank comprises a side arm that protrudes outward from the first side wall at an oblique angle, wherein the side arm comprises two parallel surfaces and a distal end;
producing acoustic waves in the liquid, wherein the acoustic waves propagate in a wave propagation direction, wherein the acoustic waves are produced by a transducer arranged at the distal end of the side arm;
orienting the substrate vertically between the first side wall and the second wall and at an angle with respect to the wave propagation direction, wherein the angle is chosen so as to maximize a transmission of the acoustic waves through the substrate; and
substantially absorbing the acoustic waves transmitted through the substrate.

2. The method according to claim 1, wherein
a layer of a damping material is arranged along an opening in the second side wall, wherein the substrate is placed between the transducer and the layer of the damping material.

3. The method according to claim 1, wherein a gas is dissolved in the liquid or added to the liquid during a production of the acoustic waves.

4. The method according to claim 2, wherein the layer of the damping material is separated from the liquid by a plate arranged along the opening in the second side wall, the plate being transparent to the acoustic waves.

5. An apparatus for cleaning a substrate, comprising:
a tank suitable for holding a cleaning liquid, wherein the tank comprises a first side wall and a second side wall parallel to the first side wall, wherein the tank comprises a side arm that protrudes outward from the first side wall at an oblique angle wherein the side arm comprises two parallel surfaces and a distal end;
an acoustic transducer arranged at the distal end of the side arm so as to be able to produce acoustic waves propagating in the cleaning liquid in the tank;
a substrate holding means for holding and maintaining a substrate in the tank, at an angle with respect to a propagation direction of the acoustic waves, the angle being chosen so as to maximize a transmission of the acoustic waves through the substrate; and
a layer of damping material arranged along an opening in the second side wall.

6. The apparatus according to claim 5, wherein the layer of the damping material is separated from an interior of the tank by a plate arranged along the opening in the second side wall, and which is transparent to acoustic waves of at least one frequency.

7. The apparatus according to claim 6, wherein the plate is a quartz plate.

8. The apparatus according to claim 5, wherein the first side wall and the second side wall are spaced apart to allow passage of the substrate in the space between the first side wall and the second side wall, whilst the substrate is oriented parallel to the first side wall and the second side wall.

9. The apparatus according to claim 5, further comprising a liquid circulation means configured to circulate the cleaning liquid out of the tank and back into the tank.

10. An apparatus for cleaning a substrate, comprising:
a tank suitable for holding a cleaning liquid, wherein the tank comprises a first side wall and a second side wall parallel to the first side wall, wherein the tank comprises a side arm that protrudes outward from the first side wall at an oblique angle, wherein the side arm comprises two parallel surfaces and a distal end;
an acoustic transducer arranged at the distal end of the side arm so as to be able to produce acoustic waves propagating in the cleaning liquid in the tank;
a substrate disposed in the tank, wherein the substrate is disposed at an angle with respect to a propagation direction of the acoustic waves, the angle being chosen so as to maximize a transmission of the acoustic waves through the substrate; and
a layer of damping material arranged along an opening in the second side wall, with the substrate disposed in between the transducer and the layer of the damping material.

11. The apparatus according to claim 10, wherein the layer of the damping material is separated from an interior of the tank by a plate arranged along the opening in the second side wall, and which is transparent to acoustic waves of at least one frequency.

12. The apparatus according to claim 11, wherein the plate is a quartz plate.

13. The apparatus according to claim 10, wherein the first side wall and the second side wall are spaced apart to allow passage of the substrate in the space between the first side wall and the second side wall, whilst the substrate is oriented parallel to the first side wall and the second side wall.

14. The apparatus according to claim 10, further comprising a liquid circulation means configured to circulate the cleaning liquid out of the tank and back into the tank.

15. The method of claim 1, wherein the transducer is arranged along an inner surface of the distal end of the side arm and wherein the transducer is in contact with the liquid.

16. The method of claim 1, wherein the transducer is fixed with respect to the tank and submerged substrate.

17. The apparatus of claim 5, wherein the acoustic transducer is arranged along an inner surface of the distal end of the side arm and wherein the acoustic transducer is in contact with the cleaning liquid in the tank.

18. The apparatus of claim 5, wherein the side arm is fixed with respect to the tank.

19. The apparatus of claim 10, wherein the acoustic transducer is arranged along an inner surface of the distal end of the side arm and wherein the acoustic transducer is in contact with the cleaning liquid in the tank.

20. The apparatus of claim 10, wherein the side arm is fixed with respect to the tank.

* * * * *